(12) United States Patent
Vanden Bossche

(10) Patent No.: US 8,891,639 B2
(45) Date of Patent: Nov. 18, 2014

(54) SYSTEM AND METHOD FOR REPRESENTING A MULTI-TONE SIGNAL

(75) Inventor: Marc Vanden Bossche, Bornem (BE)

(73) Assignee: National Instruments Ireland Resources Limited, Dublin (IE)

( * ) Notice: Subject to any disclaimer, the term of this patent is extended or adjusted under 35 U.S.C. 154(b) by 391 days.

(21) Appl. No.: 13/377,007

(22) PCT Filed: Jun. 14, 2010

(86) PCT No.: PCT/EP2010/058310
§ 371 (c)(1),
(2), (4) Date: Dec. 15, 2011

(87) PCT Pub. No.: WO2010/142811
PCT Pub. Date: Dec. 16, 2010

(65) Prior Publication Data
US 2012/0082251 A1    Apr. 5, 2012

Related U.S. Application Data

(60) Provisional application No. 61/213,487, filed on Jun. 12, 2009.

(51) Int. Cl.
*H04L 27/00* (2006.01)
*G01R 13/02* (2006.01)
*G01R 27/28* (2006.01)

(52) U.S. Cl.
CPC ............ *G01R 13/0272* (2013.01); *G01R 27/28* (2013.01)
USPC ........................................ 375/260

(58) Field of Classification Search
USPC ........... 341/118; 370/206, 316; 375/140, 259, 375/260, 316, 332, 371; 455/285, 296, 302, 455/323, 324, 334
See application file for complete search history.

(56) References Cited

U.S. PATENT DOCUMENTS 3,675,129 A    7/1972 Melvin
2003/0174641 A1*  9/2003 Rahman ........................ 370/206
(Continued)

FOREIGN PATENT DOCUMENTS

EP    1460814 A2    9/2004

OTHER PUBLICATIONS

Lott, "Measurement of Magnitude and Phase of Harmonics Generated in Nonlinear Microwave Two-Ports", IEEE Transactions on Microwave Theory and Techniques, vol. 37, No. 10, Oct. 1989, pp. 1506-1511.

(Continued)

*Primary Examiner* — Jaison Joseph
*Assistant Examiner* — Shawkat M Ali

(57) ABSTRACT

The present invention is related to a system (1) for determining a representation of a multi-tone signal (2) comprising a plurality of phase coherent tones, at least two of said phase coherent tones being modulated by a modulating signal, said system comprising an input (3) for applying the multi-tone signal (2), phase coherent mixing means (5) for demodulation in connection with data acquisition means (6) for digitization, said mixing means and data acquisition means arranged for being fed with the multi-tone signal and with a reference signal (8) comprising said phase coherent tones, each pair of phase coherent tones having a fixed phase difference, whereby the data acquisition means is arranged for being triggered by a trigger signal (4) for yielding a representation of said modulation signals with fixed delay, processing means (7) arranged for receiving digital signals output from the data acquisition means and for comparing phase information of a downconverted tone of the multi-tone signal after demodulation with phase information derived from the corresponding tone of the demodulated reference signal and further arranged for controlling the phase coherent mixing means for sequential downconversion, such that a representation of said multi-tone signal can be determined.

14 Claims, 9 Drawing Sheets

(56) References Cited

U.S. PATENT DOCUMENTS

| | | | |
|---|---|---|---|
| 2004/0137869 A1* | 7/2004 | Kim | 455/324 |
| 2004/0179625 A1 | 9/2004 | Kim | |
| 2005/0248478 A1* | 11/2005 | Ling | 341/118 |
| 2007/0058755 A1* | 3/2007 | Husted | 375/332 |
| 2007/0123188 A1* | 5/2007 | Mo et al. | 455/302 |
| 2009/0028279 A1* | 1/2009 | Kitta | 375/371 |

OTHER PUBLICATIONS

Barataud et al., "Measurements of Time-Domain Voltage/Current Waveforms at RF and Microwave Frequencies Based on the Use of a Vector Network Analyzer for the Characterization of Nonlinear Devices-Application to High-Efficiency Power Amplifiers and Frequency-Multipliers Optimization", IEEE Transactions on Instrumentation and Measurement, vol. 47, No. 5, Oct. 1998, pp. 1259-1264.

International Search Report in PCT/EP2010/058310, Feb. 23, 2011.

* cited by examiner

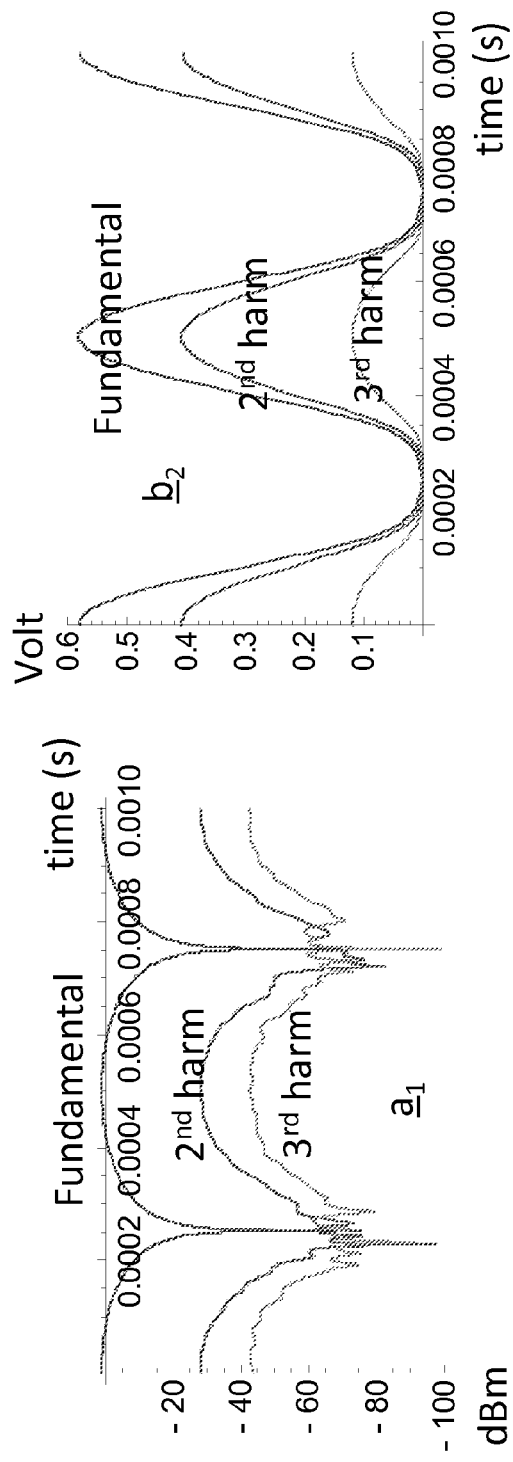
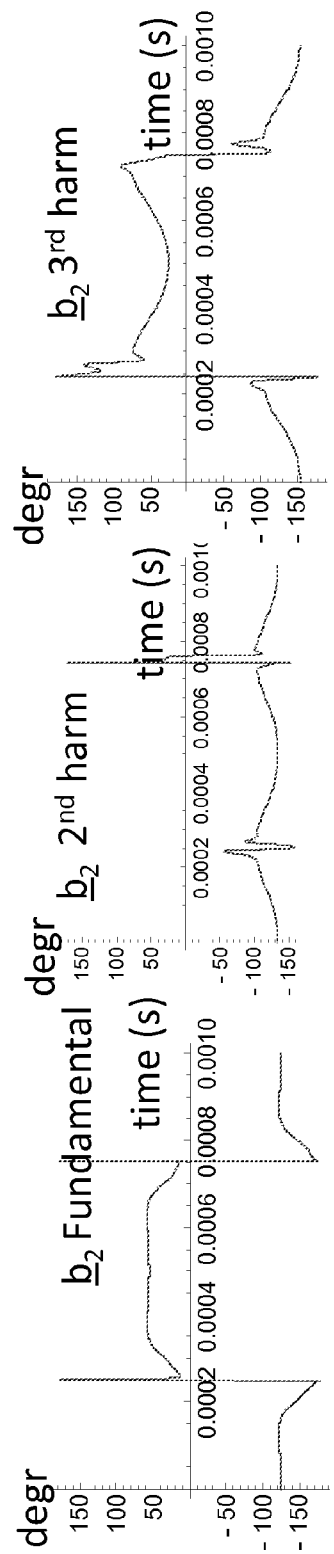
Fig. 7B
Fig. 7C

SYSTEM AND METHOD FOR REPRESENTING A MULTI-TONE SIGNAL

CROSS REFERENCE TO RELATED APPLICATIONS

The benefit of provisional application No. 61/213,487 filed on Jun. 12, 2009 is hereby claimed and the entirety of this application is incorporated herein by reference.

FIELD OF THE INVENTION

The present invention generally relates to the field of radio frequency (RF) and microwave measurement technology. More precisely, it relates to the measurement of the time aspect of RF and microwave signals and the relationship between RF and microwave signals, typically caused by a device under test which is being excited by such signal.

BACKGROUND OF THE INVENTION

Presently RF and microwave signals are mainly measured by high frequency (HF) spectrum analyzers, real-time and repetitive sampling HF oscilloscopes and HF vector signal analyzers. HF spectrum analyzers provide the amplitude spectrum of a signal as function of the frequency. HF real-time oscilloscopes use very broadband and fast-sampling data acquisition systems, usually limited by the number of bits. They also require deep memory to measure a high frequency tone, e.g. 5 GHz, which is slowly modulated, e.g. a modulation signal with a bandwidth of kHz or MHz compared to the 5 GHz of the carrier. Repetitive sampling oscilloscopes use a very broadband sampler, functioning as a sample and hold circuit, and a slower data acquisition system. They suffer from the dynamic range due to the downfolding of the high-frequency noise. They also require a repetitive trigger which is synchronous both with the HF signal and the slow modulation. When the signal is periodic in carrier and modulation separately, it is possible to synchronously sample the signal, downconverting and compressing the carrier in combination with the modulation into an intermediate frequency (IF) data acquisition which is adapted to the modulation bandwidth. Due to the compression action of the sampling converter, also all the noise of the complete spectrum is being compressed into the IF data acquisition which reduces the signal to noise ratio.

Vector signal analyzers can demodulate a modulated high frequency tone using a mixer, shifting the carrier frequency to a low frequency, band-pass filtering it to limit the noise and digitizing it. High signal to noise ratios can be achieved in this way.

Suppose a modulated carrier is passed through an amplifier, which compresses the signal. As a result modulated fundamental and harmonics will be generated. The vector signal analyzer can demodulate the different high frequency tones, namely the fundamental and harmonics separately. However, it loses the phase coherence between these tones. Hence, there is a need for overcoming this drawback.

Nowadays harmonic signals can be measured inside a network analyzer where a reference signal is used containing phase coherent tones to normalize the harmonic signals. In this way harmonic signals can be measured and calibrated in a repeatable way. Reference is made to the papers "Measurement of Magnitude and Phase of Harmonics Generated in Nonlinear Microwave Two-Ports" (U. Lott, IEEE Trans. Microwave Theory and Techniques, vol. 37, n° 10, October 1989, pp. 1506-1511) and "Measurements of time domain voltage/current waveforms at R.F. and microwave frequencies, based on the use of a Vector Network Analyzer, for the characterization of nonlinear devices. Application to high efficiency power amplifiers and frequency multipliers optimization" (D. Barataud et al., IEEE Trans. Instrumentation and Measurement, vol. 47, n° 5, October 1998, pp. 1259-1264).

AIMS OF THE INVENTION

The present invention aims to provide a system and method for representing a multi-tone signal comprising phase coherent tones, wherein the phase coherence is maintained.

SUMMARY

The present invention proposes a system and a method that measures and determines a representation of a multi-tone signal, whereby the phase coherence between the tones is maintained while correctly measuring the modulation tones such that the original signal still can be reconstructed. As such, taking the restrictions on the multi-tone signal into account, the proposed system can provide similar information as can be measured with a sampling converter, while maintaining the advantages of a vector signal analyzer (mainly dynamic range).

The proposed solution determines a representation of the applied multi-tone signal. Hence, it does not necessarily yield an exact copy: the signal can for example be distorted by the measurement system in a repeatable and determined way. The resulting signal as such is then not equal to the original signal. The latter can be reconstructed after measuring the signal representation using calibration techniques. The calibration techniques serve the purpose of determining how the measurement system distorts the signal. However, the reconstruction of the original signal by means of the calibration techniques falls beyond the scope of this invention.

The present invention relates more in particular to a system for determining a representation of a multi-tone signal comprising a plurality of phase coherent tones. At least two of the phase coherent tones have been modulated by a modulation signal. The modulation signal is typically different for the distinct phase coherent tones, but may optionally be the same for two or more tones. The system comprises an input for applying the multi-tone signal to the system. The system is further provided with phase coherent mixing means for demodulation in connection with data acquisition means for digitization. The mixing means and data acquisition means are fed with the multi-tone signal and with a reference signal comprising said phase coherent tones, each pair of phase coherent tones having an arbitrary but fixed phase difference. The data acquisition means can be triggered by a trigger signal, so that a representation of the modulation signals with fixed delay is obtained. The processing means receives digital signals output from the data acquisition means and compares sequentially phase information of the demodulated multi-tone signal with phase information derived from the corresponding tones of the demodulated reference signal and further controls at least the phase coherent mixing means for the sequential downconversion, resulting into a representation of the applied multi-tone signal.

Storage of the digitized demodulated signals can be performed either in the data acquisition means or in the processing means.

In a preferred embodiment of the invention the phase coherent mixing means is implemented as separate mixing means for downconverting the multi-tone signal and the reference signal, respectively. The separate mixing means are then connected to a common local oscillator. The common oscillator sequentially downconverts the tones, irrespective of whether they are modulated or not. In one embodiment the data acquisition means is then implemented as separate data acquisition units that digitize the downconverted multi-tone signal and reference signal, respectively. The data acquisition units are then triggered by a common trigger signal. It is to be noted that the separate mixing means may be implemented as parts of a single unit. The same can be said with respect to the data acquisition units.

In a preferred embodiment the system comprises generator means for generating the reference signal internally. Alternatively, the reference signal is generated externally to the system of the invention and then applied to it. In any case, the phase coherent tones of the reference signal need to be phase coherent with the modulated multi-tone signal. This can possibly be achieved by sharing a reference clock.

The generator means is optionally arranged for generating the phase coherent tones of the reference signal with a frequency offset compared to the phase coherent tones of the multi-tone signal.

In another preferred embodiment the generator means is implemented as a phase coherent synthesizer means. This phase coherent synthesizer means then replaces the combination of generator means and phase coherent mixing means for the reference signal. This yields as advantage that the need for an additional downconversion and data acquisition path for the reference signal is eliminated.

In one embodiment of the invention the modulation signals are repetitive. With repetitive is meant that a time limited phenomenon repeats itself in time but not necessarily with a same time interval. In another embodiment the modulation signals have a common periodicity. In this case the trigger signal can be a periodic pilot signal generated along with the multi-tone signal, whereby the periodic pilot signal has said common periodicity. A dedicated input for the pilot signal may be provided, replacing the trigger input.

In another embodiment the system further comprises signal conditioning means. The signal conditioning means can be amplification means and/or attenuation means and/or filtering means. The signal conditioning means can be positioned before the phase coherent mixing means and/or between the mixing means and the data acquisition means. In this way certain noise contributions are removed and signal levels can be optimized for proper operation of the phase coherent mixing means and data acquisition means.

In a preferred embodiment the frequency content of each modulated tone of the phase coherent modulated multi-tone signal does not overlap with the frequency content of any other modulated tone.

Advantageously the phase coherent tones are equally spaced.

The invention also relates to a network analyser comprising a system for determining a representation of an applied multi-tone signal as previously described.

In another aspect the invention relates to a method for determining a representation of a multi-tone signal comprising a plurality of phase coherent tones, whereby at least two of the phase coherent tones are modulated by a modulation signal. The method comprises the steps of:
applying the multi-tone signal and a reference signal comprising the phase coherent tones, each pair of phase coherent tones having a fixed phase difference, to phase coherent mixing means for demodulation in connection with data acquisition means for digitization, whereby the various phase-coherent tones of said multi-tone signal and said reference signal are sequentially downconverted and digitized using a trigger signal for obtaining the modulation signals with fixed delay,
for each downconverted tone of the demodulated multi-tone signal comparing phase information with phase information derived from the corresponding tone of the demodulated reference signal, such that a representation of the multi-tone signal can be derived.

As already discussed previously, the trigger signal can be implemented as a periodic pilot signal in case the modulating signals are periodic.

In an advantageous embodiment the comparing step comprises a phase normalisation.

BRIEF DESCRIPTION OF THE DRAWINGS

FIG. 7B illustrates on one plot the amplitude of the modulation signal as a function of time corresponding to fundamental, second and third harmonic of a1 (dBm) and b2 (Volt).

FIG. 7C illustrates in three plots the phase of the modulation signal as function of the time corresponding to fundamental, second and third harmonic of b2 (degr), respectively.

DETAILED DESCRIPTION OF THE INVENTION

The proposed solution allows measuring and reconstructing a specific class of signals. These signals comprise a set of separate phase coherent tones which are being modulated with signals $a_k(t)$:

$$\text{Re}\left(\sum_{k=1}^{N} a_k(t)e^{-i\omega_k t + \vartheta_k}\right)$$

with $a_k(t) \in \mathbb{C}$, i.e. complex signals. The signal $a_k(t)$ is referred to as a modulation signal. One term $a_k(t)e^{-i\omega_k t + \vartheta_k}$ in the sum of the above expression is referred to as a modulated tone, while the whole expression represents the phase coherent multi-tone signal, also simply called multi-tone. It is possible that one or more modulation signals are constant in time: $a_k(t) = A_k \in \mathbb{C}$. At least two modulation signals are time-variant. The collection of all modulation signals $\underline{M}(t) = \{a_k(t)\}$ is either repetitive or periodic. Repetitive means that there is a time limited phenomenon that repeats itself in time but not necessarily with a same time interval:

$$M(t_1+t) = M(t_0+t) \text{ with } 0 \le T_p \text{ and } t_1 \in R$$

whereby $T_p$ represents the duration of the phenomenon. In other words, it is possible to derive a trigger signal from the vector $\underline{M}(t)$ to indicate the time after which the repetitive phenomenon re-appears. Periodic means that $\underline{M}(t)=\underline{M}(t-\tau)$ with $\tau$ representing the the periodicity. All modulation signals then share that common periodicity. In order to generate phase coherent tones with either repetitive or periodic modulation, one typically requires a reference clock, e.g. 10 MHz, to synthesize the phase coherent tones at different frequencies. This type of signal can also be generated by applying a modulated tone to a nonlinear device which will generated phase coherent modulated harmonics.

Figure 1:
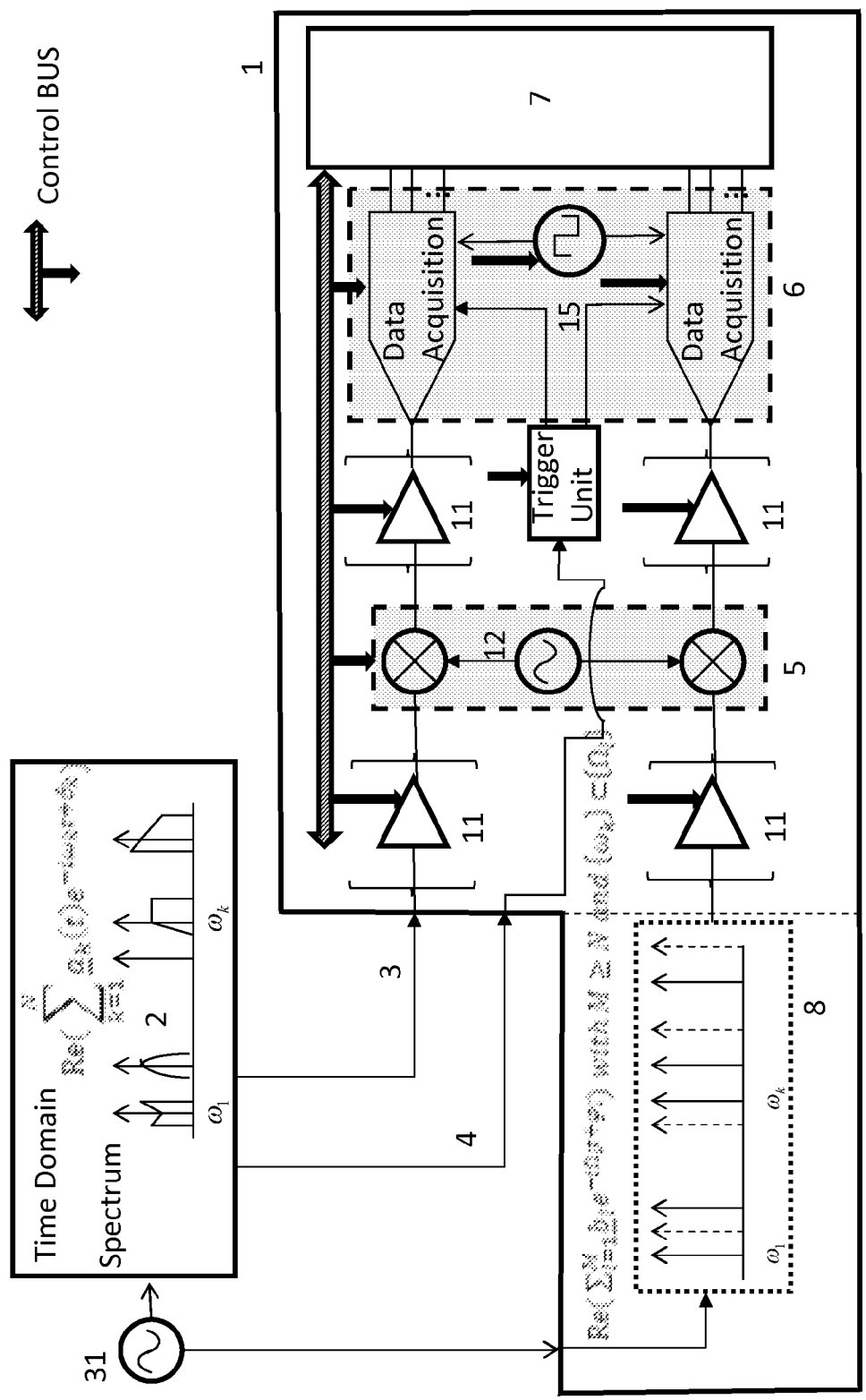
FIG. 1 illustrates a first embodiment of the system according to the present invention.

FIG. 1 shows one embodiment of the system of the invention. The system (1) takes a multi-tone signal (external signal) (2) at its input (3). At least two of the tones are modulated. Basically, the system downconverts, digitizes and collects each tone sequentially in parallel with a reference signal, that contains (unmodulated) tones at the same frequencies, and phase normalises each tone of the multi-tone signal against the phase of the corresponding tone of the reference signal. The tones of the reference signal and the multi-tone signal are phase coherent. In the embodiment of FIG. 1 this is realized by a common reference clock (31). The system has a trigger input (4) to trigger the data acquisition means (6).

More in detail, the measurement system (1) of FIG. 1 comprises an input (3) to which the multi-tone signal (2) comprising phase coherent tones is applied. The signal (2) is fed into a mixing means (5), possibly after passing through signal conditioning means (11). Signal conditioning may comprise amplification, attenuation and/or filtering. The mixer is driven by an oscillator (12), the frequency of which is tunable such that the modulation signals $a_k(t)$ can be downconverted individually. Possibly the mixer can be a harmonic mixer or an alternative means allowing the downconversion of the modulation signals $a_k(t)$ individually. Each individually downconverted modulation signal $a_k(t)$ is then digitized by a data acquisition system (6), possibly after passing through signal conditioning means (11) (like an amplifier, attenuator, filter, . . . ). This data acquisition means (6) contains at least an analogue to digital (A/D) converter to convert the signal from an analogue signal into a digital signal. The data acquisition is properly set up, e.g. taking care at least of sampling rate and possible aliasing effects, such that one obtains a digitized version of the original signal. This digital version can be denoted as $a_k(nT_s-\tau_i)\epsilon^{\phi i}$ with $T_s$ the sampling period where $1/T_s$ is the sampling frequency. For each demodulated signal or modulation signal $a_k(t)$ there is an arbitrary delay $T_i$ and phase offset $\phi_i$ which change from one measurement to a next. This arbitrary delay and phase offset pose a problem for obtaining a representation of the original signal. Optionally, the data acquisition means can store the digitized signals. The data acquisition is followed by a processing unit (7) which may store the downconverted and sampled modulated signals (in case they are not already stored in the data acquisition means) and which converts these signals into the frequency domain for further processing.

To eliminate the arbitrary delay, one uses a trigger signal, derived from the vector $\underline{M}(t)$ of the applied multi-tone signal, to trigger the data acquisition system. As such the measurement system has an input for the trigger signal (4). This trigger signal is typically created by the same means that generates the external signal. Other means are thinkable. Possibly the measurement system has some internal means to derive a trigger signal itself. The generation and use of a trigger signal works for both repetitive and periodic $\underline{M}(t)$. Due to the presence of the trigger signal, all modulation signals are getting a fixed delay during the data acquisition.

Figure 2:
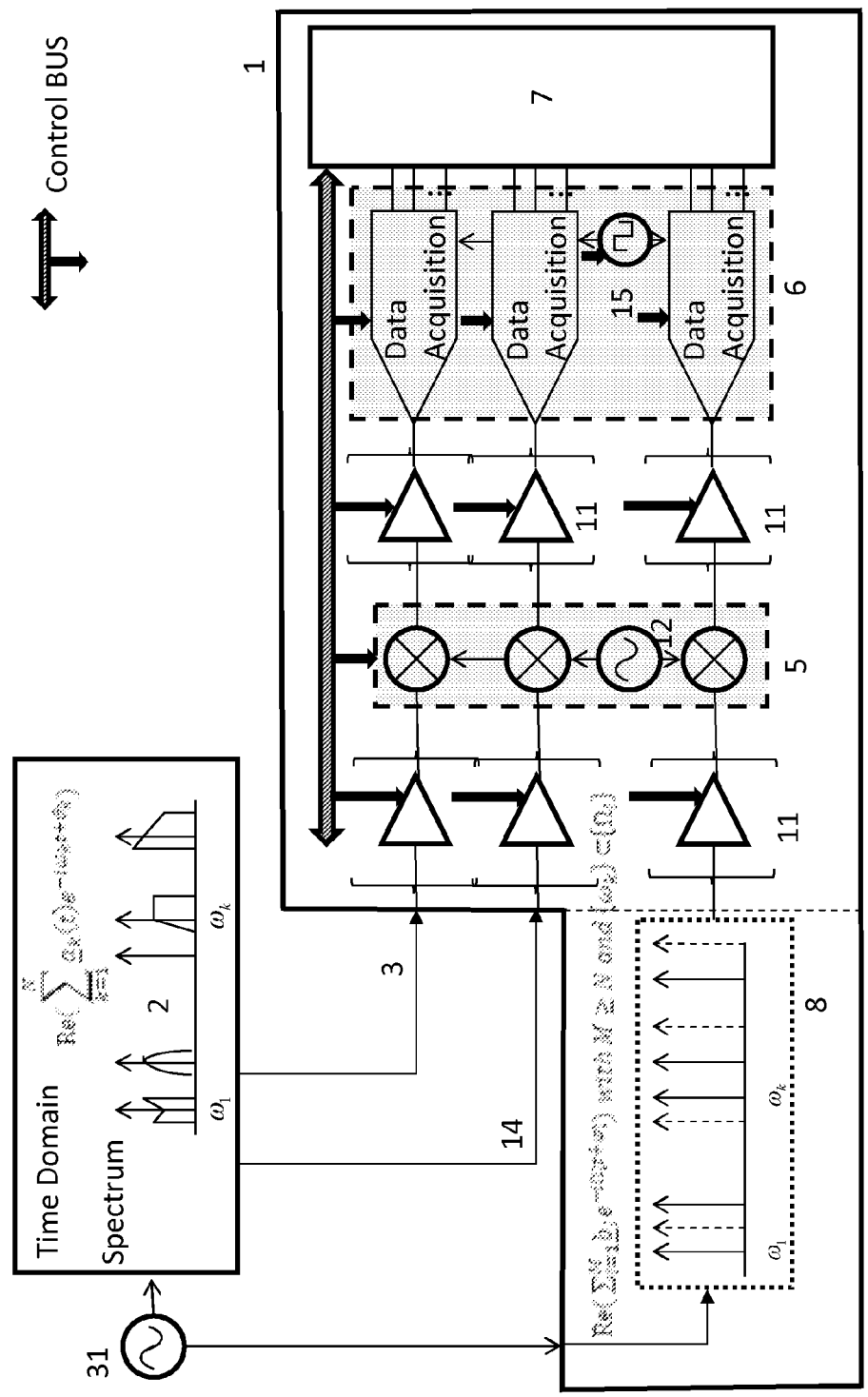
FIG. 2 illustrates a second embodiment of the system of the invention using a periodic pilot signal instead of a trigger.

In case the vector $\underline{M}(t)$ is periodic, the trigger mechanism can be implemented as a pilot signal (14) $p(t)=p(t-\tau)$ which gets digitized together with each at the expense of employing another data acquisition channel. FIG. 2 represents such an embodiment of the system that can be used when the modulation tones have a common periodicity. The external trigger has been replaced by the combination of an external pilot tone having the common periodicity of all the modulation signals and an additional downconversion and data-acquisition unit in the system. In this case, the processing unit (7) is used to apply the measured delay of $p(\tau-\tau_i)$ to the pilot signal and the modulation signal. One can then delay $a_k(nT_s-\tau_i)$ and $p(nT_s-\tau_i)$ resulting each time in $p(nT_s)$ and eliminate the changing delay in the modulation signal. As such all digitized modulation signals are set to a fixed delay in the processing unit (7).

The remaining problem is the arbitrary phase offset introduced when downconverting the modulated signal individually. This problem can be solved by using a reference signal (8) generated either in the measurement system (1) or externally to the measurement system. The reference signal (8) contains at least a set of phase coherent tones at the same frequencies as the multi-tone signal that one wants to reconstruct. In the embodiment of FIG. 1 this reference signal is then measured with the phase coherent mixing means and data acquisition means and processed in the processing unit. The phases of the tones do not have to be the same as the external signal phases to be measured, but the phase difference between the tones may not change and while measuring or scanning simultaneously the tones of the external and reference signal, the external signal and the reference signal may not slip against each other. The reference signal can be described as:

$$r(t) = \text{Re}\left(\sum_{l=1}^{M} B_l e^{-i\Omega_l t + \varphi_l}\right)$$

with $\{\omega_k\} \subset \{\Omega_l\}$, i.e. the phase coherent tones in the applied multi-tone signal to be measured are also present in the reference signal. In the embodiment of FIG. 1 this reference signal (8) is fed to the phase coherent mixing means in parallel with the signal to measure. This mixer is driven by the same oscillator or at least by an oscillator that is phase coherent with the oscillator used in the path of the multi-tone signal. After downconversion the reference signal goes into a data acquisition channel which is clocked by the same sampling clock (15) or a sampling clock that is phase coherent with the sampling clock, which samples the signal to be measured. Knowing that the tones of the reference signal are phase coherent, do not slip during the measurement with the signal to measure and have a fixed phase difference, the processing unit (7) can normalize the phases of the signal to measure against the reference signal phases. This eliminates the phase offset, which changes for each measurement, and replaces it with a repeatable and fixed phase offset for each tone, referenced to the reference signal. When the measurement system is perfect, the representation of the signal to measure becomes in the processing unit:

$$\text{Re}\left(\sum_{k=1}^{N} a_k(t-\tau)e^{-i\omega_k t + \Phi_k}\right)$$

This remains the same for each measurement (except for the noise contribution).

However, the real resulting signal is distorted in amplitude and phase by the measurement system. The resulting signal as such will therefore not be equal to the input signal. The fixed and repeatable delay and phase offset need to be determined to reconstruct the signal to measure in combination with the additional amplitude and phase distortion created by the measurement system. Using calibration signals and/or individual characterization of the blocks in the downconversion and the data acquisition, one can correct for the distortions and finally reconstruct the original signal. The correction techniques are not part of this invention.

Figure 3:
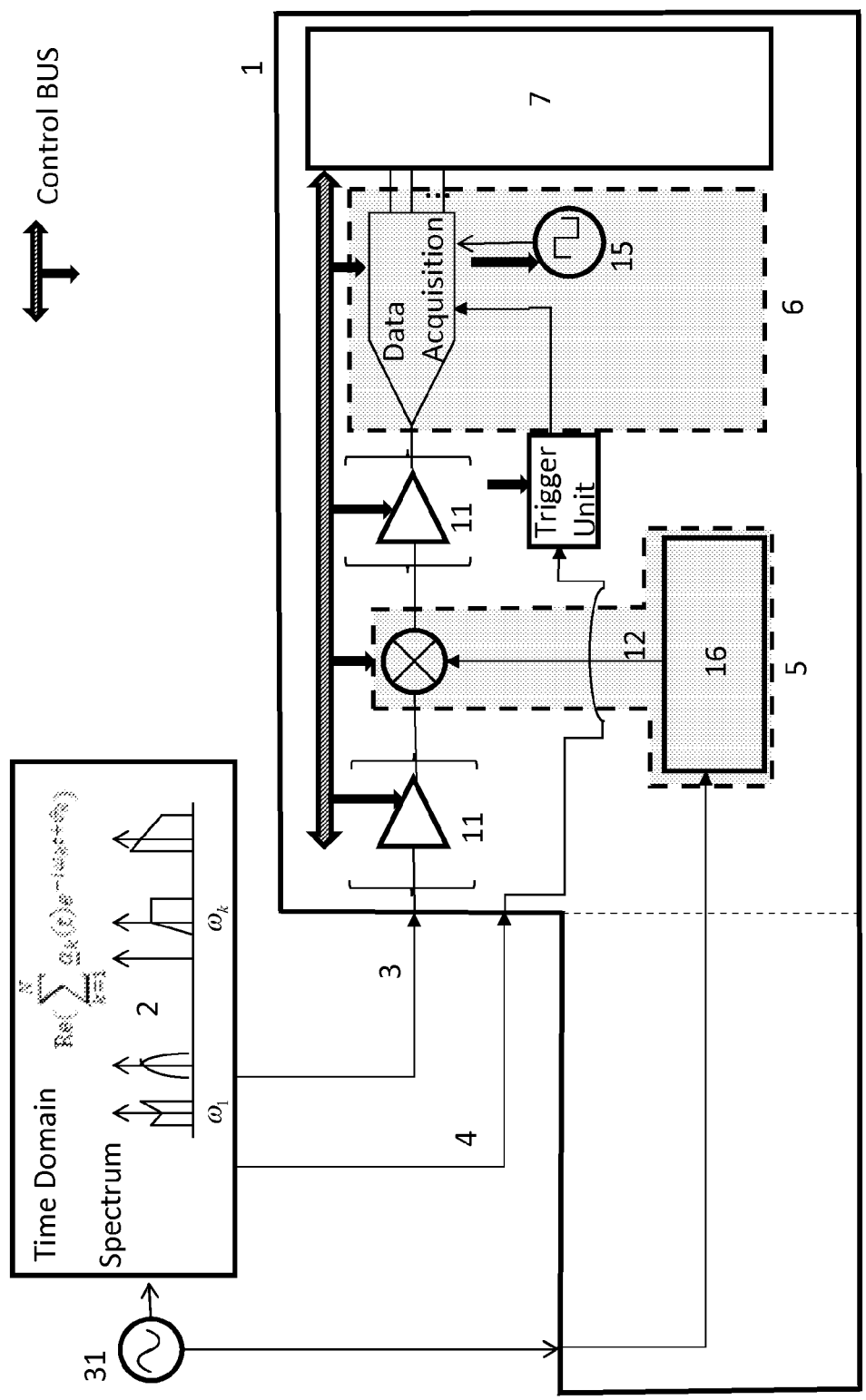
FIG. 3 illustrates an embodiment wherein a trigger and phase coherent synthesizer is applied replacing the reference signal.

Instead of using a reference signal against which the measured signal gets normalized, it is possible to use as reference signal a phase coherent synthesized local oscillator (16) signal which maintains the repeatable phase coherence compared to the tones present in the measurement signal when it is being stepped from one frequency to the other. This is possible nowadays using DDS (Direct Digital Synthesis) techniques, which synthesize the local oscillator signal at the different frequencies in a phase coherent way from a common reference clock (31). FIG. 3 illustrates such an embodiment of the system according to this invention, where the combination of reference signal with downconversion and data-acquisition unit of FIG. 1 has been replaced by a phase-coherent synthesizer (16), which has to be phase-coherent with the external multi-tone signal (2). This can be realized by a common reference clock.

Figure 4:
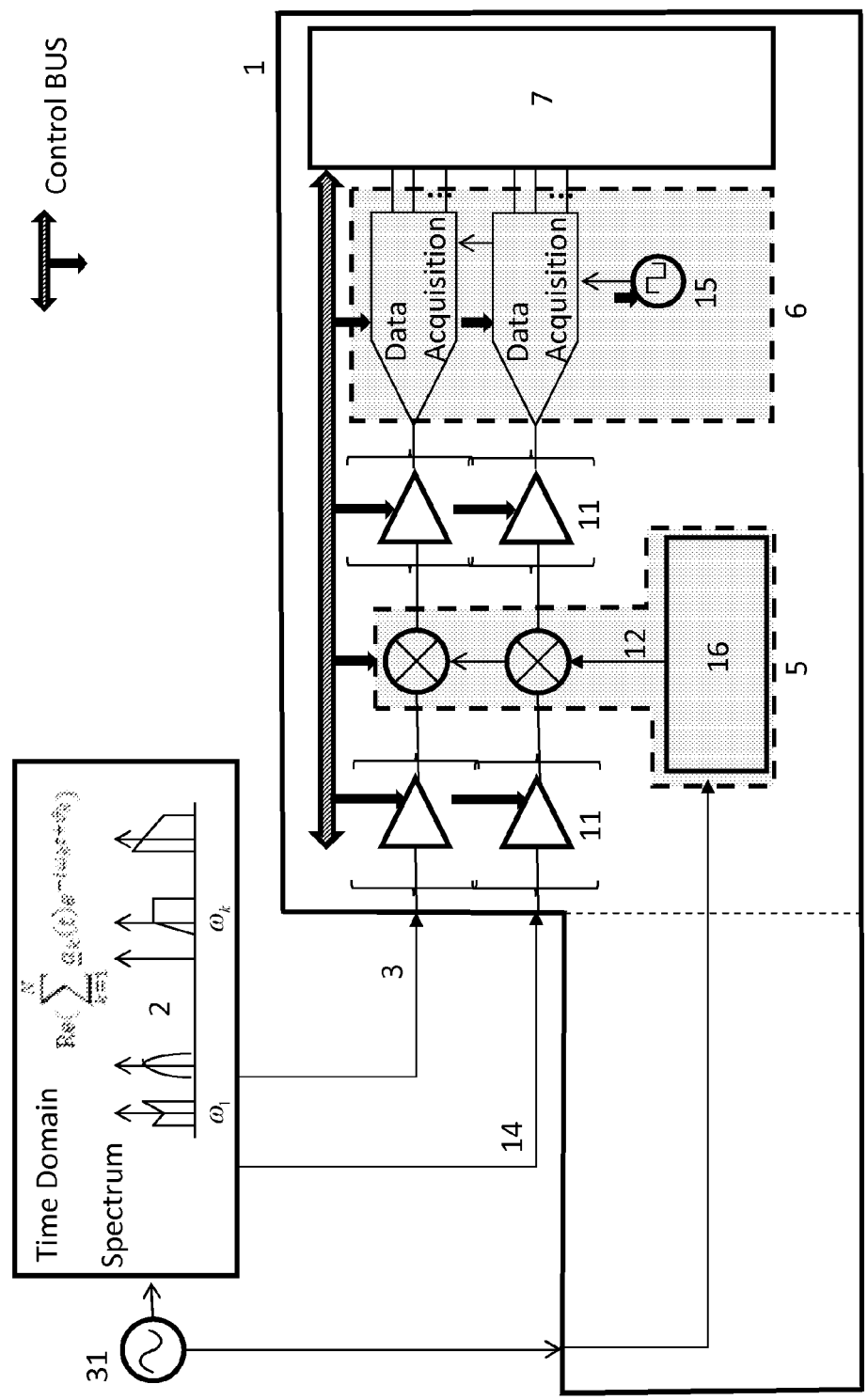
FIG. 4 illustrates an embodiment using a periodic pilot signal and a phase coherent synthesizer.

FIG. 4 illustrates a further embodiment of the system. As compared to FIG. 2, the combination of reference signal with downconversion and data-acquisition unit has been replaced by a phase-coherent synthesizer (16), which has to be phase-coherent with the external multi-tone signal (2). Again, the latter can be realized by a common reference clock. Similar as explained before, it is possible to either use the trigger (FIG. 3) or the pilot tone (FIG. 4) to determine the proper delay of the modulation signals.

Figure 5:
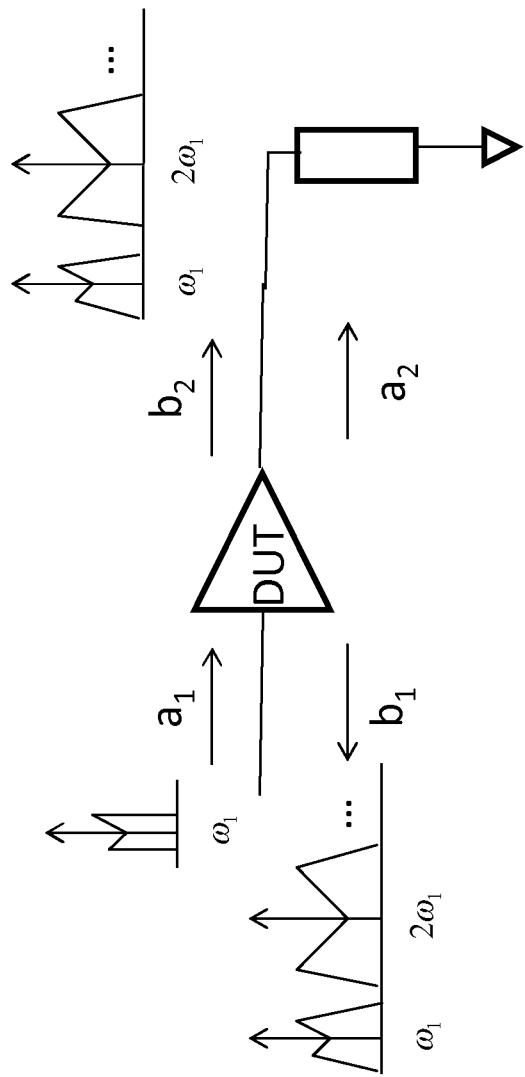
FIG. 5 represents a device under test excited by one modulated tone and its response.

The above described measurement system can be used to measure any signal of the class of signals for which it has been designed. As such it can be an extension of the spectrum analyzer or the signal analyzer. However, it can advantageously be used to measure modulated or pulsed RF signals applied to a device under test (DUT), for which the response needs to be measured. Typically this occurs inside a vector network analyzer where a stimulus is generated and the response of the device is measured through a test set. FIG. 5 gives a simple, non-limiting example. It illustrates a typical stimulus—response situation of a device under test where one modulated tone is generated as incident wave (a1) and where through the nonlinear behaviour of the device harmonics are generated with intermodulation and spectral regrowth on the harmonics (b1, b2, a2). This invention allows measuring a representation of these input and output signals. The aim of the test set is to separate the incident and reflected waves (or voltages and currents) and to be able to measure them by means of downconversion, data acquisition and processing unit. As such this system may contain the measurement system (1) as described above, possibly equipped with different signal inputs for incident and reflected waves or in combination with switches to measure the incident and reflected waves sequentially. Due to the nonlinearities of the device under test, harmonics are generated and intermodulation and spectral regrowth of the modulation is occurring. This results in signals with an extended set of modulated phase coherent tones which are correlated to the excitation signal.

Such RF signals, typically containing modulated high frequency carriers, cannot be measured properly with conventional means. Nowadays a real-time high-frequency oscilloscope is useable but this has the drawback of requiring a high sample rate due the HF carrier and deep memory due to the slow modulation (as compared to carrier modulation). The measurement system of the invention as described overcomes this problem by converting each modulation tone separately and phase coherently reconstructing a representation of the signal. As the modulation signals are measured separately, the signal can be filtered properly eliminating out-of-band noise, improving the dynamic range of the measurements. This capability comes at the price of generating a phase coherent reference signal (either internally or externally) or replacing it by a phase coherent synthesizer. In network analyzers, where one is typically generating the stimulus and measuring the response of a device, the generation of such reference signal is rather easy, In fact, present commercial network analyzers, measuring the nonlinear behavior of components are exactly doing this to measure the phase of harmonics. Now it has been extended to measure the modulation signals in a repeatable way.

Figure 6:
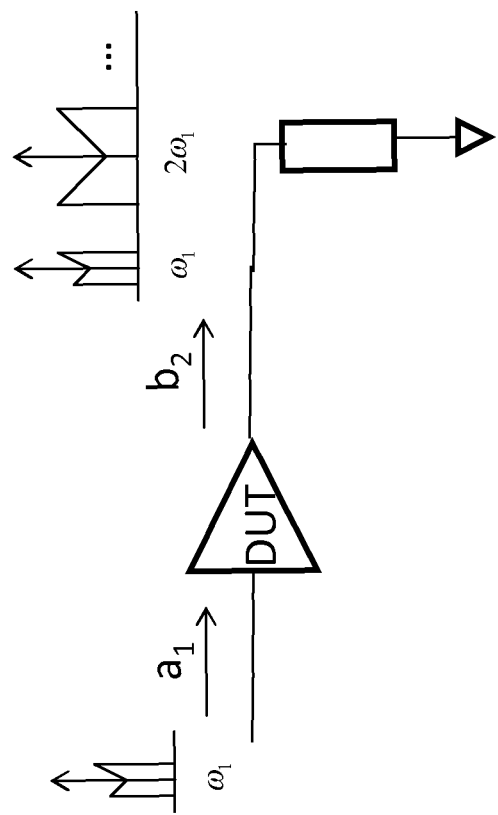
FIG. 6 illustrates a matched device under test excited by one modulated tone and its response.
Figure 7A:
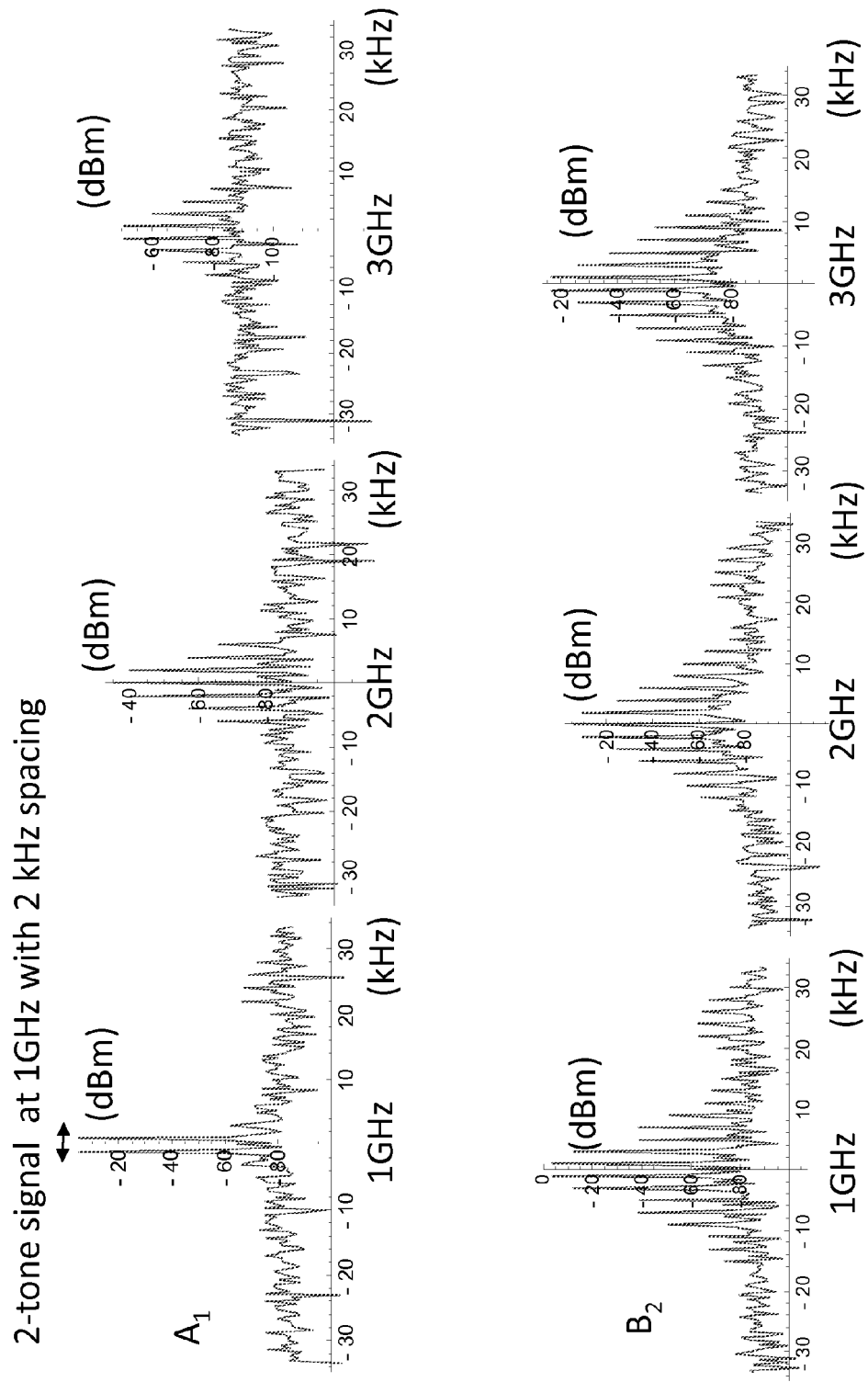
FIG. 7A illustrates the fundamental, second and third harmonic of a1 and b2 for a two-tone excitation in the frequency domain.
Figure 7D:
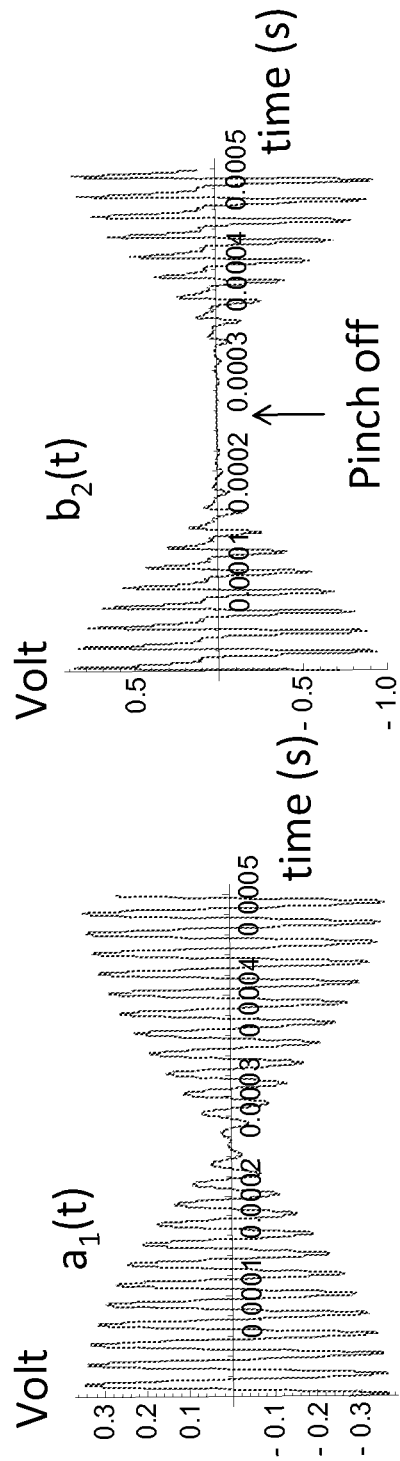
FIG. 7D illustrates the time domain incident a1 and transmitted wave b2 as function of time, whereby the carrier has been reduced artificially in frequency.

As an example of the invention, one considers a matched nonlinear device (FIG. 6). It will be excited by a high frequency two-tone (FIG. 7) at 1 GHz with a spacing of 2 kHz. The device is a FET transistor which has been biased in pinch off. As such one is sure that modulated harmonics will be generated. The plots contain signals which represent the phase-coherent multi-tones, but which are not calibrated. In FIG. 7A one can see the spectral tones around the carrier (1 GHz), the second harmonic (2 GHz) and the third harmonic (3 GHz) for a1 and b2. It is clear that a1 has much smaller harmonics. In FIG. 7B one sees the amplitude of the modulation signals corresponding to the fundamental, the second and third harmonic of a1 and b2. It is clearly seen that b2 has higher harmonics. The spectral regrowth can also been observed. These measurements are repeatable and the delay between the modulation signals stay fixed. FIG. 7C shows that also the phase information as function of time is available for the modulation signals, corresponding to the fundamental, second and third harmonic. In FIG. 7D one sees the complete multi-tone corresponding to a1 and b2 containing fundamental and harmonics. The carrier has been shifted artificially to a lower frequency to make the carrier visible underneath the envelope. It is clearly seen that a certain signal level of a1 is required before b2 rises out of the noise. This is because the device is biased into pinch off. It can also been seen that the carrier contains fundamental and harmonics which do have a certain phase relationship, Due to the reference signal, this signal stays the same in shape and is repeatable. The data acquisition unit had a bandwidth of 10 MHz and 10 harmonics were included to reconstruct the time domain signals.

Although the present invention has been illustrated by reference to specific embodiments, it will be apparent to those skilled in the art that the invention is not limited to the details of the foregoing illustrative embodiments, and that the present invention may be embodied with various changes and modifications without departing from the scope thereof. The present embodiments are therefore to be considered in all respects as illustrative and not restrictive, the scope of the invention being indicated by the appended claims rather than by the foregoing description, and all changes which come within the meaning and range of equivalency of the claims are therefore intended to be embraced therein. In other words, it is contemplated to cover any and all modifications, variations or equivalents that fall within the spirit and scope of the basic underlying principles and whose essential attributes are claimed in this patent application. It will furthermore be understood by the reader of this patent application that the words "comprising" or "comprise" do not exclude other elements or steps, that the words "a" or "an" do not exclude a plurality, and that a single element, such as a computer system, a processor, or another integrated unit may fulfil the functions of several means recited in the claims. Any reference signs in the claims shall not be construed as limiting the respective claims concerned. The terms "first", "second", "third", "a", "b", "c", and the like, when used in the description or in the claims are introduced to distinguish between similar elements or steps and are not necessarily describing a sequential or chronological order. Similarly, the terms "top", "bottom", "over", "under", and the like are introduced for descriptive purposes and not necessarily to denote relative positions. It is to be understood that the terms so used are interchangeable under appropriate circumstances and embodiments of the invention are capable of operating according to the present invention in other sequences, or in orientations different from the one(s) described or illustrated above.

The invention claimed is:

1. A system for determining a representation of a multi-tone signal, said system comprising:
   an input for applying said multi-tone signal that includes a plurality of phase-coherent tones, at least two of said plurality of phase-coherent tones being modulated according to respective modulation signals;
   phase-coherent mixing means for demodulation in connection with data acquisition means for digitization, wherein said mixing means and data acquisition means are arranged to be fed with said multi-tone signal and with a reference signal that includes said plurality of phase-coherent tones, each pair of phase-coherent tones having a fixed phase difference, wherein said data acquisition means is arranged to be triggered by a trigger signal yielding a representation of said modulation signals with fixed delay; and
   processing means arranged to receive digital signals output from said data acquisition means and to compare phase information of a downconverted tone of said multi-tone signal after demodulation with phase information derived from the corresponding tone of said reference signal after demodulation, and further arranged to control said phase-coherent mixing means for sequential downconversion, thereby enabling representation of said multi-tone signal, wherein said comparing includes a phase normalization.

2. The system as in claim 1, wherein said phase-coherent mixing means comprises separate mixing means for downconverting said multi-tone signal and said reference signal, respectively, said separate mixing means being connected to a common local oscillator.

3. The system as in claim 2, whereby said data acquisition means comprises separate units for digitizing said downconverted multi-tone signal and said downconverted reference signal, respectively.

4. The system as in claim 1, further comprising generator means for generating said reference signal.

5. The system as in claim 4, wherein said generator means is arranged to give the phase-coherent tones of said reference signal a frequency offset with respect to the phase-coherent tones of said multi-tone signal.

6. The system as in claim 4, wherein said generator means is a phase-coherent synthesizer means.

7. The system as in claim 1, wherein said modulating signals are repetitive.

8. The system as in claim 7, wherein said modulation signals are periodic.

9. The system as in claim 1, wherein said trigger signal is a periodic pilot signal.

10. The system as in claim 1, further comprising signal conditioning means, said signal conditioning means comprising one or more of: an amplifier, an attenuator means, or a filter.

11. The system as in claim 1, wherein frequency content of a first one of the at least two of said plurality of phase-coherent tones does not overlap with frequency content of another of the at least two of said plurality of phase-coherent tones.

12. The system as in claim 1, wherein said phase-coherent tones are equally spaced.

13. The system as in claim 1, wherein the system is comprised in a network analyzer.

14. A method for determining a representation of a multi-tone signal, said method comprising:
   applying said multi-tone signal and a reference signal to phase-coherent mixing means for demodulation in connection with data acquisition means for digitization, wherein the multi-tone signal comprises a plurality of phase-coherent tones, wherein at least two phase-coherent tones of said plurality of phase-coherent tones are modulated according to respective modulation signals, wherein the reference signal comprises said plurality of phase-coherent tones, wherein each pair of said plurality of phase-coherent tones has a fixed phase difference, wherein the phase-coherent tones of the at least two phase-coherent tones of said multi-tone signal and said reference signal are sequentially downconverted and digitized using a trigger signal for obtaining said respective modulation signals with fixed delay; and
   for each downconverted tone of the demodulated multi-tone signal, comparing phase information with phase information derived from the corresponding tone of the demodulated reference signal, and further controlling said phase-coherent mixing means, thereby enabling representation of the multi-tone signal, wherein said comparing includes a phase normalization.

* * * * *